United States Patent
Michalke et al.

(10) Patent No.: US 10,089,419 B2
(45) Date of Patent: Oct. 2, 2018

(54) METHOD AND APPARATUS FOR SEGMENTING AN OCCUPANCY GRID FOR A SURROUNDINGS MODEL OF A DRIVER ASSISTANCE SYSTEM FOR A VEHICLE BACKGROUND OF THE INVENTION

(71) Applicant: Robert Bosch GmbH, Stuttgart (DE)

(72) Inventors: Thomas Michalke, Stuttgart (DE); Claudius Glaeser, Ditzingen (DE); Lutz Buerkle, Stuttgart (DE)

(73) Assignee: ROBERT BOSCH GMBH, Stuttgart (DE)

(*) Notice: Subject to any disclaimer, the term of this patent is extended or adjusted under 35 U.S.C. 154(b) by 986 days.

(21) Appl. No.: 14/550,093

(22) Filed: Nov. 21, 2014

(65) Prior Publication Data

US 2015/0154328 A1 Jun. 4, 2015

(30) Foreign Application Priority Data

Nov. 21, 2013 (DE) .................. 10 2013 223 803

(51) Int. Cl.
*G06F 17/50* (2006.01)
*B60W 40/04* (2006.01)

(52) U.S. Cl.
CPC ......... *G06F 17/5009* (2013.01); *B60W 40/04* (2013.01); *G06F 17/5095* (2013.01)

(58) Field of Classification Search
None
See application file for complete search history.

(56) References Cited

U.S. PATENT DOCUMENTS

| 6,163,252 A | * | 12/2000 | Nishiwaki | B60Q 9/006 340/435 |
| 6,205,380 B1 | * | 3/2001 | Bauer | G05D 1/0221 180/169 |
| 2006/0293856 A1 | * | 12/2006 | Foessel | B60W 30/09 701/301 |
| 2008/0027591 A1 | * | 1/2008 | Lenser | G05D 1/0251 701/2 |

FOREIGN PATENT DOCUMENTS

DE  102004007553  9/2005
EP  1731922  12/2006

* cited by examiner

*Primary Examiner* — Timothy A Mudrick
(74) *Attorney, Agent, or Firm* — Norton Rose Fulbright US LLP; Gerard Messina

(57) ABSTRACT

A method is described for segmenting an occupancy grid for a surroundings model of a driver assistance system for a vehicle. The method encompasses a step of reading in an occupancy grid having a plurality of grid cells, each grid cell of the plurality of grid cells having assigned to it a grid cell information item that encompasses an information item about a degree of occupancy and at least one additional information item about the grid cell; and a step of assigning at least one object and/or a plurality of objects to the plurality of grid cells using the grid cell information item, in order to segment the occupancy grid for a surroundings model.

9 Claims, 6 Drawing Sheets

METHOD AND APPARATUS FOR SEGMENTING AN OCCUPANCY GRID FOR A SURROUNDINGS MODEL OF A DRIVER ASSISTANCE SYSTEM FOR A VEHICLE BACKGROUND OF THE INVENTION

BACKGROUND OF THE INVENTION

Field of the Invention

The approach presented here relates to a method for segmenting an occupancy grid for a surroundings model of a driver assistance system for a vehicle, to a corresponding apparatus for segmenting an occupancy grid for a surroundings model of a driver assistance system for a motor vehicle, and to a corresponding computer program product.

Background Information

Modern driver assistance systems conform to a structure and are based on a model of the vehicle surroundings. A surroundings model of this kind can contain, for example, properties of other objects (such as their position) or open-area information. Measurements of a wide variety of sensors present in the vehicle, for example a camera, radar, ultrasound, lidar, etc., can be used to construct a surroundings model.

Grid-based approaches to surroundings modeling are very popular in robotics because they represent an efficient tool for model-free surroundings representation and for sensor data fusion. An occupancy grid subdivides the robot's surroundings into discrete regions (grid cells), occupancy of a grid cell reflecting the degree of occupancy of the corresponding region in the robot's surroundings. Building on experience from robotics, occupancy grids are more and more often being utilized in driver assistance systems.

German Published Patent Application No. 10 2004 007 553 describes a sensing apparatus and safety system for a motor vehicle.

European Published Patent Application No. 1 731 922 discloses a method and an apparatus for identifying open areas in the environment of a motor vehicle.

SUMMARY

In light of the above, the approach presented here presents a method for segmenting an occupancy grid for a surroundings model of a driver assistance system for a vehicle; furthermore an apparatus for segmenting an occupancy grid for a surroundings model of a driver assistance system for a vehicle, which apparatus uses said method; and lastly a corresponding computer program product, in accordance with the main claims. Advantageous embodiments are evident from the respective dependent claims and from the description that follows.

Occupancy grids are suitable for modeling the vehicle surroundings based on a variety of sensors. An occupancy grid of this kind can be enhanced with object information, for example in order to be better usable for a situation analysis. The object information can be identified using grid cell information, such as speed or height, of the grid cell.

A method for segmenting an occupancy grid for a surroundings model of a driver assistance system for a vehicle is presented, the method having the following steps:

reading in an occupancy grid having a plurality of grid cells, each grid cell of the plurality of grid cells having assigned to it a grid cell information item that encompasses an information item about a degree of occupancy and at least one additional information item about the cell; and assigning at least one object, and additionally or alternatively a plurality of objects, to the plurality of grid cells using the grid cell information item, in order to segment the occupancy grid for a surroundings model.

By assigning one or more objects to the grid cells of an occupancy grid, the grid can be segmented and grid cells assignable to an object can be further processed as a unit. A better surroundings model for a driver assistance system can thereby be created.

It is also favorable if, in an embodiment, the method further encompasses a step of projecting the plurality of grid cells as transformed grid cells into a feature space using the grid cell information item. In the assigning step, the at least one object, and additionally or alternatively the plurality of objects, can be assigned to the plurality of grid cells using the grid cells transformed into the feature space or information items derived therefrom.

The method can furthermore encompass a step of extracting proximity relationships between the grid cells transformed into the feature space. In the extraction step, a graph can be prepared using the proximity relationships. Nodes of the graph can represent the grid cells, and edges between the nodes can represent proximity relationships. In the assigning step, the at least one object, and additionally or alternatively the plurality of objects, can be assigned to the plurality of grid cells using the proximity relationships and additionally or alternatively the graph and additionally or alternatively information derived therefrom.

A further advantage of the invention consists in its calculation efficiency. Converting the problem of grid segmentation into the problem of segmenting a graph makes it possible to use a variety of (already known) efficient algorithms. Calculation efficiency can be further increased with suitable heuristics for constructing the graphs. "Grid segmentation" can be understood here as segmentation of the occupancy grid.

Furthermore, in an allocating step, a weight can be allocated to each edge of the graph using the proximity relationships. The weight can represent an affiliation of two nodes connected by the edge with one and the same object, and additionally or alternatively with two different objects. Advantageously, object affiliations in the graph can thereby be strengthened or elucidated.

In an embodiment, the method encompasses a step of segmenting the graph using the weight of each edge. Nodes can be combined here into sub-graphs. A sub-graph can encompass only nodes of one object. In the assigning step, the at least one object, and additionally or alternatively the plurality of objects, can be assigned to the plurality of grid cells using the segmented graph and additionally or alternatively the sub-graphs and additionally or alternatively information items derived therefrom.

Also favorable is a transforming step after the segmenting step. In the transforming step, the grid cells of the occupancy grid can be assigned to an object using the sub-graphs of the graph.

In an embodiment, the method encompasses a step of predicting object assignments for the plurality of grid cells after the reading-in step. The grid cell information item for each grid cell can encompass a predicted object assignment. In the predicting step, the object assignment can be predicted using an object assignment and, additionally or alternatively, a grid cell information item from a previous execution of the method. An "object assignment" can be understood here as an assignment of an object to a grid cell. An "object assignment" can also be understood as an assignment of a plurality of grid cells to an object, or of an object to a plurality of grid cells.

Additionally in the predicting step, for each grid cell of the plurality of grid cells, a grid cell information item is predicted using an object assignment and, additionally or alternatively, a grid cell information item from a previous execution of the method.

The approach presented here furthermore creates an apparatus for segmenting an occupancy grid for a surroundings model of a driver assistance system for a vehicle, the apparatus having the following features:

an interface for reading in an occupancy grid having a plurality of grid cells, each grid cell of the plurality of grid cells having assigned to it a grid cell information item that encompasses an information item about a degree of occupancy and at least one additional information item about the cell; and a device for assigning at least one object, and additionally or alternatively a plurality of objects, to the plurality of grid cells using the grid cell information item, in order to segment the occupancy grid for a surroundings model.

The apparatus is embodied to carry out or implement the steps of a variant of a method presented here in corresponding devices. The object on which the invention is based can also be achieved quickly and efficiently using this variant embodiment of the invention in the form of an apparatus.

An "apparatus" can be understood in the present case as an electrical device that processes sensor signals and, as a function thereof, outputs control signals and/or data signals. The apparatus can have an interface that can be embodied in hardware- and/or software-based fashion. With a hardware-based embodiment the interfaces can be, for example, part of a "system ASIC" that contains a wide variety of functions of the apparatus. It is also possible, however, for the interfaces to be separate integrated circuits or to be made up at least in part of discrete components. With a software-based embodiment the interfaces can be software modules that are present, for example, on a microcontroller alongside other software modules.

Also advantageous is a computer program product having program code that can be stored on a machine-readable medium such as a semiconductor memory, a hard-drive memory, or an optical memory, and is used to carry out the method in accordance with one of the embodiments described above when the program product is executed on a computer or an apparatus.

DETAILED DESCRIPTION

Figure 1:
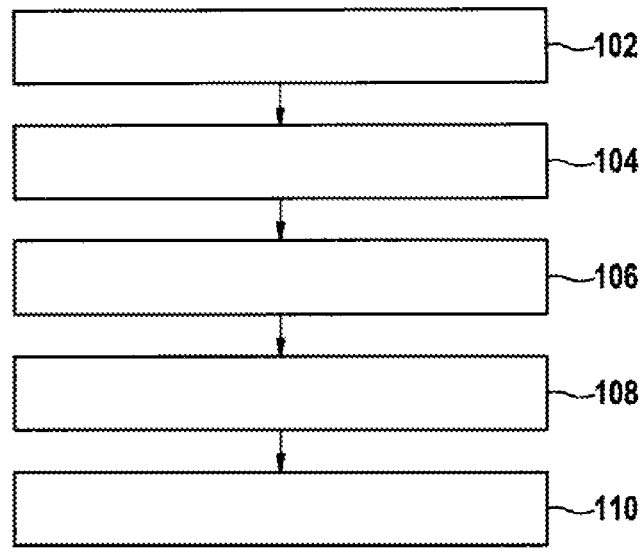
FIG. 1 is a block diagram of a sequential processing structure of a driver assistance system.

In the description below of favorable exemplifying embodiments of the present invention, identical or similar reference characters are used for the elements of similar function depicted in the various Figures, repeated description of these elements being omitted.

FIG. 1 is a block diagram of a sequential processing structure of a driver assistance system. A block 102 represents a sensor suite of a vehicle which furnishes sensor data that represent an information item about a surroundings of the vehicle. In a block 104 the sensor data are processed to yield a surroundings model, which in a block 106 is subjected to a situation analysis, the surroundings model being evaluated. A function or a system intervention is identified in a block 108, and in a block 110 is implemented as an application of control to an actuator suite or to a display.

Driver assistance systems conform to the typical sequential structure shown in FIG. 1. Based on a model of the vehicle surroundings in block 104, the present situation is evaluated in block 106. More precisely, the system ascertains whether a situation relevant for the function is present, and identifies the function-related criticality that exists. In the functional layer or block 108, the nature of the system intervention is then calculated, and in block 110 control is applied to an actuator suite or to display elements.

Figure 2:
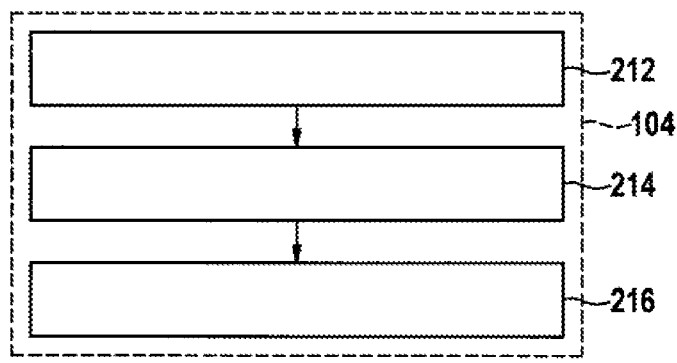
FIG. 2 is a flow chart of a method for segmenting an occupancy-grid-based surroundings model with a more precise analysis of the objects formed, according to an exemplifying embodiment of the present invention.

FIG. 2 is a flow chart of a method for segmenting an occupancy-grid-based surroundings model 104 with a more precise analysis of the objects formed, according to an exemplifying embodiment of the present invention. In a block 212 an occupancy grid is constructed. In a block 214 the occupancy grid is segmented and then, in a block 216, passes through a further processing of the object hypotheses, for example tracking and/or classification.

Figure 3:
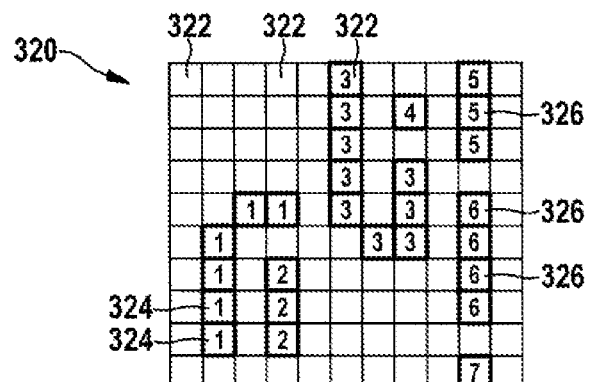
FIG. 3 shows an occupancy grid with segmentation using "connected component labeling".

FIG. 3 shows an occupancy grid 320 with segmentation using "connected component labeling." Occupancy grid 320 can be regarded as a table having a plurality of rows and a plurality of columns. The exemplifying embodiment shown in FIG. 3 encompasses eleven columns and ten rows, resulting in a hundred and ten grid cells 322. Some of the hundred and ten grid cells 322 possess an occupancy information item 324 or a degree of occupancy 324 together with a object assignment 326. In the exemplifying embodiment shown, a distinction is made among seven objects 326 differing from one another, each of which has a number between one and seven assigned to it. It is evident here that grid cells 322 which are assigned to an object 326 are always adjacent, either at a common boundary along a row or column or via a corner of grid cell 322.

In the description below the rows will be sequentially numbered from top to bottom and the columns from left to right in order to describe grid cells 322 having a positive occupancy information item 324 or a probable or definite degree of occupancy 324. In the second column, grid cells 322 in rows six to nine have a positive degree of occupancy 324 and are assigned to a first object 326. In the fifth row, the third and fourth grid cells 322 are occupied and are assigned to a first object 326. In the fourth column, grid cells 322 in rows seven to nine have a positive degree of occupancy 324 and are assigned to a second object 326. In the sixth column, grid cells 322 in rows one to five have a positive degree of occupancy 324 and are assigned to a third object 326, as are the sixth grid cell 322 in the seventh column and, in the eighth column, grid cells 322 in rows four to six. In the eighth column, the second cell has a positive degree of occupancy 324 and is assigned to a fourth object 326. In the tenth column, grid cells 322 in rows one to three have a positive degree of occupancy 324 and are assigned to a fifth object 326. In the tenth column, grid cells 322 in rows five to eight have a positive degree of occupancy 324 and are assigned to a sixth object 326. In the tenth column, grid cell 322 in the tenth row has a positive degree of occupancy 324 and is assigned to a seventh object 326.

Although occupancy grids 320 are outstandingly suitable for modeling the vehicle surroundings based on various sensors, without post-processing they can be used only to a limited extent in subsequent situation analysis. Because of the model-free representation, for example, an occupancy grid 320 yields no information regarding objects 326. Information about objects 326 in the vehicle surroundings, however, for example their type, dimensions, or motions, are of particular interest in order to allow evaluation of a situation. An occupancy-grid-based surroundings model is therefore often post-processed in accordance with FIG. 2: firstly occupancy grid 320 is segmented (i.e. an assignment of grid cells 322 to objects 326 is performed) and then objects 326 that have been formed are analyzed more precisely, for example tracked and classified.

In the sector of driver assistance systems the "connected components labeling" method is used, for example, to segment occupancy grids 320. In this, proceeding from an arbitrary occupied cell, all adjacent (occupied) cells 322 are recursively allocated to the same object ID 326. This operation is repeated until all occupied grid cells have been assigned to an object 326. The method is used because of its efficiency in terms of calculation time, contiguous regions of the grid being allocated to the same object 326.

A method for segmenting an occupancy grid in accordance with an exemplifying embodiment of the present invention will be explained further with reference to the subsequent FIGS. 4 to 7. Proceeding from an occupancy grid having additional information (here, speeds) regarding the occupancies in FIG. 4, the grid cells are firstly transformed into a feature space as shown in FIG. 5. Corresponding to the positions in the feature space, a graph that reflects the proximities between the grid cells is constructed according to FIG. 6. A method for segmenting the graph finds subgraphs in FIG. 6 which reflect the affiliation of the grid cells with objects, for example as depicted in FIG. 7.

Figure 4:
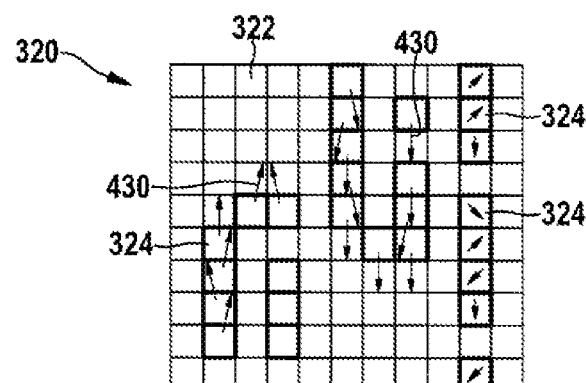
FIG. 4 schematically depicts an occupancy grid having grid cells and grid cell information items assigned thereto, according to an exemplifying embodiment of the present invention.
Figure 5:
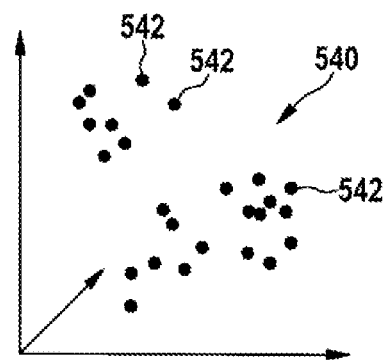
FIG. 5 schematically depicts a feature space having grid cells transformed into the feature space, according to an exemplifying embodiment of the present invention.

FIG. 4 schematically depicts an occupancy grid 320 having grid cells 322 and grid cell information items 430 assigned to them, according to an exemplifying embodiment of the present invention. Occupancy grid 320 can be an exemplifying embodiment of occupancy grid 320 shown in FIG. 3. Instead of the object assignment of grid cells 322 shown in FIG. 3 having a probable or definite degree of occupancy 324, what is shown for these grid cells 322 is a grid cell information item 430 using the example of a speed of the corresponding grid cell 322. The speed is depicted as a vector, which has a direction and whose length represents speed.

Occupancy grids 320 are particularly well suited for representing static obstacles, since these always occupy the same grid cells 322 and different measurements can therefore easily be fused. Dynamic (i.e. moving) obstacles, on the other hand, are difficult to represent in occupancy grids 320. One possibility for dealing with dynamic obstacles is to consider not only position but also speed as an example of a grid cell information item 430 of obstacles.

So-called "4D Bayesian occupancy filtering" (4D BOF) uses a four-dimensional occupancy grid (two-dimensional position plus two-dimensional speed) for this purpose. Occupancy of a grid cell 322 means here that an obstacle having the corresponding speed is present in the corresponding region of the vehicle surroundings. In order to avoid expanding the state space, it is alternatively possible to allocate a speed distribution to the occupancies of a grid. In both variants, an occupancy that has a speed not equal to zero, i.e. that is dynamic, can thus transition from one grid cell 322 into another grid cell 322.

An advantage of the aforesaid method is that in addition to the positions of obstacles, their speeds can also be estimated. It is useful here to sense the speed of obstacles using sensors (e.g. radar), and to incorporate the measurements into the estimate. But even without corresponding speed measurements, the method is capable of probabilistically drawing conclusions as to the speeds of obstacles based on an integration over time of occupancy information items, for example from video, lidar, etc.

The method is based on the assumption that the occupancies of different grid cells 322 are mutually independent (in the probability-theory sense). This assumption is often violated, however, since an object typically occupies multiple grid cells 322. The result is that artifacts are often obtained in the estimated speeds and thus also in the estimated degrees of occupancy of grid cells 322. According to FIG. 2, occupancy grids 320 are used as a pre-processing step, for example in order to carry out sensor data fusion. Subsequent object formation and grid segmentation, and more precise analysis of the objects formed, complete the surroundings model.

In contrast to most existing methods, it is useful not to construct occupancy grid 320 in exclusively model-free fashion, but instead to use any knowledge available about objects in the vehicle surroundings in accordance with FIG. 3 while constructing occupancy grid 320. One method has been recommended, for example, that uses knowledge about objects present in the vehicle surroundings in order to improve the speed estimate. Another method uses knowledge about possible object classes. More precisely, motion models for various object classes, for example pedestrians or a vehicle, are predefined and their assignment to the occupancies of the grid is estimated and is utilized accordingly. This therefore demonstrates, by way of example, that object knowledge can be utilized during the construction of an occupancy grid. At the same time, however, it is limited to a specific instance.

FIG. 5 schematically depicts a feature space 540 having grid cells 542 transformed into feature space 540, according to an exemplifying embodiment of the present invention. Feature space 540 is depicted as a three-dimensional Cartesian coordinate system. The transformed grid cells 542 are depicted as points in the three-dimensional coordinate system. In an exemplifying embodiment, feature space 540 shown in FIG. 5, having the transformed grid cells 542, is obtained by projecting the grid cells of the occupancy grid shown in FIG. 4 using the grid cell information item.

Figure 6:
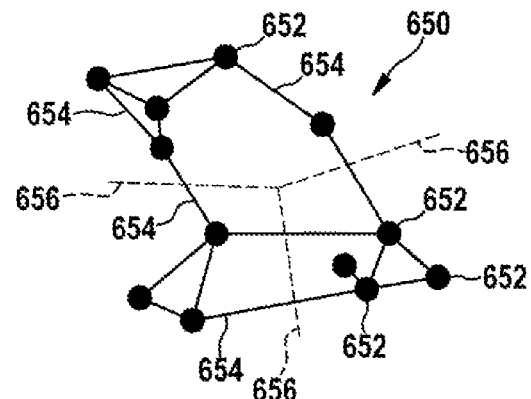
FIG. 6 schematically depicts a graph constructed using proximity relationships between transformed grid cells, according to an exemplifying embodiment of the present invention.
Figure 7:
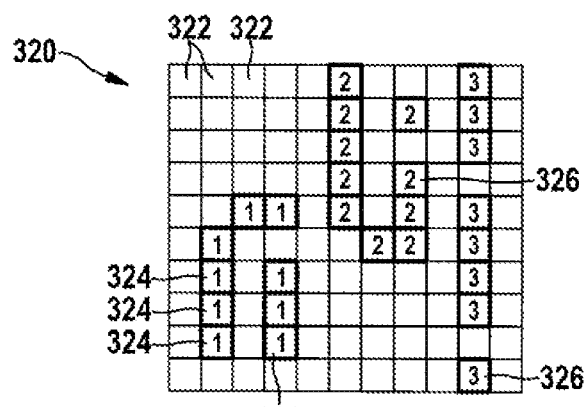
FIG. 7 schematically depicts an occupancy grid with object assignments of the grid cells, according to an exemplifying embodiment of the present invention.

FIG. 6 schematically depicts a graph 650 according to an exemplifying embodiment of the present invention. The graph is constructed using proximity relationships between transformed grid cells, as depicted in FIG. 5. Nodes 652 respectively represent grid cells or transformed grid cells, and edges 654 between nodes 652 represent proximity relationships between the grid cells. In an exemplifying embodiment, weights are assigned to edges 654 in graph 650.

In an exemplifying embodiment, in an optional segmenting step separating lines 656 are drawn in graph 650, which lines assign nodes 652 to different objects. In the graph depicted in FIG. 6, nodes 652 are subdivided by separating lines 656 into three sub-graphs, and nodes 652 are assigned to three different objects.

One aspect of an exemplifying embodiment of the present invention is to implement a method for segmenting an occupancy grid. In an exemplifying embodiment, the segmentation is not exclusively based on the occupancy probabilities of the grid, but instead uses further information items. Examples of such information items are the speed or height of the obstacles inside the grid cells. These information items are typically used during construction of the occupancy grid, but can also be used to segment the grid. A graph as depicted in FIG. 6 is used for segmentation, grid cells being the nodes of the graph and cell proximities being represented by edges between the nodes. Advantageously, various algorithms that are particularly suitable for graph-based segmentation of an occupancy grid are used. Because driver assistance systems represent real-time applications, the calculation efficiency of the method is important. In an exemplifying embodiment, the segmentation is implemented in such a way that the method is efficiently executed on a corresponding apparatus or in a corresponding control unit, and the occupancy grid is segmented accordingly.

FIG. 6 illustrates a method step for segmenting an occupancy grid. In contrast to existing methods, the method is not based on predefined proximity relationships between the cells. Instead, proximity relationships are identified adaptively based on the features of grid cells. In addition to the position of cells, a wide variety of features such as speed or height can have an influence here with different weights. Thanks to the use of adaptive proximity relationships and the possibility of a comprehensive description of features, problems of over- and under-segmentation can advantageously be minimized or in fact entirely avoided.

The proximity relationships identified in this manner are represented in the form of a graph 650 (grid cells=nodes 652; proximity=edges 654 between nodes 652). This has the advantage that a variety of efficient algorithms for segmenting a graph 650 can be used to segment an occupancy grid. In addition, it is easy to incorporate external object knowledge, for example from an image-based object segmentation, into the segmentation of the occupancy grid. All that is necessary for this is to increase or reduce the weights of edges 654 of graph 650 in accordance with the external information item. A weight of an edge is increased when two adjacent nodes are affiliated with different objects. A weight of an edge 654 is correspondingly decreased when two adjacent nodes 652 are affiliated with the same object.

One advantage of the method consists in calculation efficiency. Converting the problem of grid segmentation into the problem of segmenting a graph makes it possible to use a variety of (already known) efficient algorithms. Calculation efficiency can be further increased with suitable heuristics for constructing the graphs.

FIG. 7 schematically depicts an occupancy grid 320 having object assignments 326 of grid cells 322, according to an exemplifying embodiment of the present invention. Occupancy grid 320 can be an exemplifying embodiment of an occupancy grid 320 shown in FIG. 3 or FIG. 4.

In the description below, analogously to the description in FIG. 3, the rows will be sequentially numbered from top to bottom and the columns from left to right in order to describe grid cells 322 having a positive occupancy information item 324 or a probable or definite degree of occupancy 324. In the second column, grid cells 322 in rows six to nine have a positive degree of occupancy 324 and are assigned to a first object 326. In the fifth row, the third and fourth grid cells 322 are occupied and are assigned to first object 326. In the fourth column, grid cells 322 in rows seven to nine furthermore have a positive degree of occupancy 324 and are assigned to first object 326.

In the sixth column, grid cells 322 in rows one to five have a positive degree of occupancy 324 and are assigned to a second object 326, as are the sixth grid cell 322 in the seventh column and, in the eighth column, grid cells 322 in rows four to six. In the eighth column, the second cell has a positive degree of occupancy 324 and is assigned to second object 326.

In the tenth column, grid cells 322 in rows one to three have a positive degree of occupancy 324 and are assigned to a third object 326. In the tenth column, grid cells 322 in rows five to eight have a positive degree of occupancy 324 and are assigned to third object 326. In the tenth column, grid cell 322 in the tenth row has a positive degree of occupancy 324 and is assigned to third object 326.

Advantageously, a real object that, as a result of measurement inaccuracies of the sensor or properties of the scene (e.g. masking), is not depicted in the grid as a contiguous occupancy is classified as one object. The grid is thus not over-segmented, i.e. no more objects are formed than really exist. This problem could also be counteracted by way of a previously predefined greater proximity relationship between the cells, but this quickly leads to under-segmentation of the grid, i.e. different objects are incorrectly combined. A further advantage of the method is that additional information items about occupancy properties (such as the speed or height of objects), as well as additional information items about the object affiliation of grid cells (e.g. from a visual object detection), can easily be incorporated.

Figure 8:
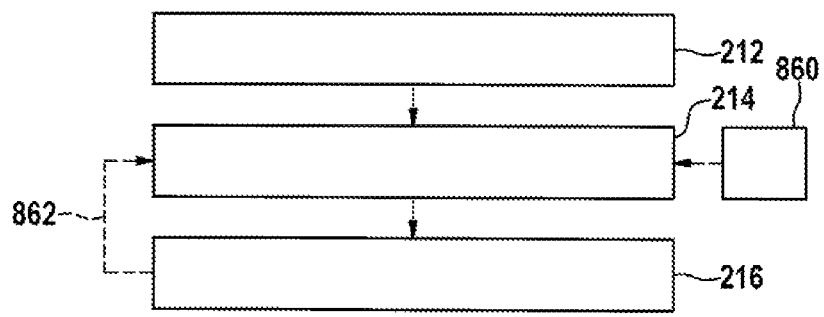
FIG. 8 is a block diagram of a segmentation of an occupancy grid, according to an exemplifying embodiment of the present invention.

FIG. 8 is a block diagram of a segmentation of an occupancy grid, according to an exemplifying embodiment of the present invention. The occupancy grid can be an exemplifying embodiment of an occupancy grid that is shown in FIG. 3, FIG. 4, and FIG. 7 and is labeled with the reference character 320. The block diagram shown in FIG. 8 is similar to the block diagram described in FIG. 2. In a block 212, an occupancy grid is constructed or read in. In a block 214 subsequent thereto, a segmentation of the occupancy grid is carried out, so that then in a final block 216 a further processing of object hypotheses, for example tracking or classification, can be carried out. Optionally, block 214 additionally receives "external" segmentation information 860. An external segmentation information item 860 here represents a segmentation information item 860 furnished by another processing module or by another method. In block 216, optionally an "internal" segmentation information item 862 is furnished, which in an exemplifying embodiment is optionally furnished to block 214 and is used in a subsequent time step in order to segment the occupancy grid.

In an exemplifying embodiment shown in FIG. 8, segmentation of the occupancy grid incorporates further information items. These can derive from other processing modules ("external") or can be the result of object formation from previous time steps ("internal").

One aspect of a method for segmenting an occupancy grid 320 is depicted in FIGS. 4 to 7 and will be described below. Each of the Figures can be regarded as a method step or as a result of a method step. The starting point is an occupancy grid 320 that contains, besides degree of occupancy 324, additional information items about the occupancies of grid cells 322. In FIG. 4, for example, the speeds of the obstacles that occupy grid cells 322 are depicted. Also conceivable, however, are other features such as height, object type, etc.

In a first step of a method for segmenting an occupancy grid, grid cells 322 are projected into an N-dimensional feature space 540 in accordance with the features used (position, speed, height, etc.). One such feature space 540 is depicted in FIG. 5. Grid cells 322 that possess similar features already form clusters in feature space 540. Because grid cells 322 in FIG. 4 that are affiliated with the same object are notable for similar features, the purpose of segmentation is to extract these clusters.

In a second step of a method for segmenting an occupancy grid, proximity relationships between grid cells 322 or transformed grid cells 542 are extracted and are stored in the form of a graph 650, as depicted and described in FIG. 6. Nodes 652 of graph 650 represent grid cells 322, whereas edges 654 between nodes 652 represent proximities. A variety of methods can be used to construct a graph 650 of this kind. In an exemplifying embodiment, predefined proximities are used. For example, a completely networked graph 650 can be generated (every cell is a neighbor of every other cell), or the 4-fold or 8-fold proximities known from other methods can be used. With the latter, each grid cell 322 is connected respectively to four or eight neighbors; only the two-dimensional grid positions of cells 322 play a role. A second possibility is to generate the proximities adaptively. For example, one cell 322, 542 can be neighbor to all other cells 322, 542 that are located in feature space 540 at a specific radius from cell 542. Alternatively, each cell 322, 542 can be connected to its k nearest neighbors. A final possibility for defining proximities results from combining predefined and adaptive proximities.

Once the cell proximities have been found, edges 654 of graph 650 have weights allocated to them which reflect the affiliation of the corresponding nodes 652 with objects. A small weight here represents the fact that two cells are affiliated with the same object, and a large weight represents the fact that two cells are affiliated with different objects. Here and already in the construction of graph 650, the different features are optionally given different weights depending on the exemplifying embodiment. This can be achieved either by corresponding scaling of the feature dimensions or by selecting a suitable distance metric, for example a Mahalanobis distance.

In an exemplifying embodiment, in a final step of a method for segmenting an occupancy grid 320, graph 650 that has been constructed is segmented, i.e. edges are "cut" so that the remaining contiguous parts of graph 650 each contain only nodes/cells 652 that are affiliated with the same object. A variety of known methods can be used to segment graph 650. Examples thereof are clustering methods such as hierarchical clustering, or graph-cut methods such as those used in image processing.

A substantial advantage of the method described here is that further information items about the affiliations of cells 322 with objects can be incorporated in accordance with FIG. 8. Additional information items of this kind can be either "external" in nature, i.e. the result of other processing modules, for example segmentation of camera images, or can be "internal" in nature, e.g. segmentation results of preceding time steps. Additional information items of this kind can easily be incorporated by corresponding adaptation of the edge weights of the graph.

Calculation-efficient segmentation of occupancy grid 320 can be ensured by the use of efficient algorithms for segmenting a graph 650. In addition to selection of the specific segmentation method, the construction of graph 650 plays an essential role with regard to run time. The general rule here is that the smaller the graph, the more quickly it is segmented. For this reason, the use of suitable heuristics to construct the graph can make a substantial contribution to calculation efficiency.

Figure 9:
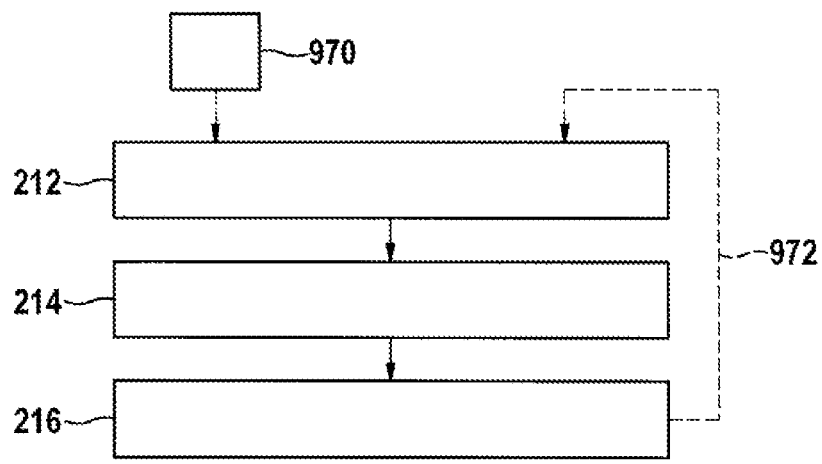
FIG. 9 is a block diagram of a segmentation of an occupancy grid with object knowledge, according to an exemplifying embodiment of the present invention.

FIG. 9 is a block diagram of a segmentation of an occupancy grid with object knowledge, according to an exemplifying embodiment of the present invention. The occupancy grid can be an exemplifying embodiment of an occupancy grid that is shown in FIG. 3, FIG. 4, and FIG. 7 and is labeled with the reference character 320. The block diagram shown in FIG. 9 is similar to the block diagrams described in FIG. 2 and FIG. 8. In a block 212, an occupancy grid is constructed or read in. In a block 214 subsequent thereto, a segmentation of the occupancy grid is carried so that a further processing of object hypotheses, for example tracking or classification, can then be carried out in a final block 216. In the exemplifying embodiment shown in FIG. 9, block 212 receives sensor data 970 and, additionally or alternatively, object knowledge 972 that is obtained in block 216.

In addition to the model-free integration of sensor data 970, object knowledge 972 that is made available as the result of other processing steps, in particular of a method step represented by block 216, can be used to construct the occupancy grid.

One aspect of the invention presented is the implementation of a method for constructing an occupancy grid which stores and propagates in the occupancy grid not only a degree of occupancy (and possibly further properties such as the speed of occupancies), but also assignments of grid cells to objects. The cell-object assignments can be used in various ways to construct the occupancy grid or also for subsequent analysis of the occupancy grid.

The use of cell-object assignments will be demonstrated below with reference to concrete examples and implementations, for example a segmentation of occupancy grids, an association of segments between time steps, a use of object-specific motion models, or a use of object-specific observation models.

A method for the construction and analysis of occupancy grids is described. In contrast to existing methods, assignments of grid cells to objects are stored in the occupancy grid and are propagated in accordance with the dynamic properties of the grid. Because cell-object assignments reflect object knowledge 972, it is thereby possible to use this knowledge during the construction of an occupancy grid. It is not assumed that the occupancies of the various grid cells are mutually independent in the probability-theory sense. Instead, the correlation between grid cells that are occupied by the same object is explicitly modeled. Ambiguities that occur on a grid-cell level can thus be resolved by the incorporation of knowledge on an object level.

Figure 10:
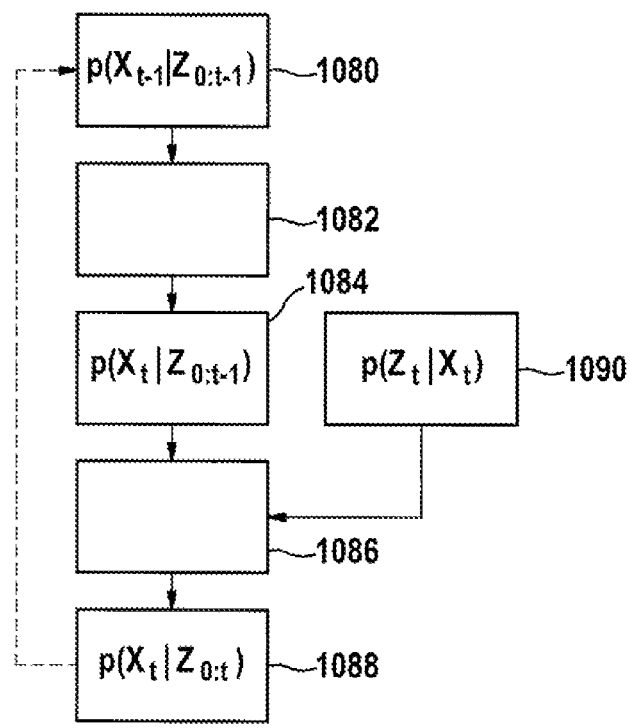
FIG. 10 is a block diagram of a recursive processing structure for segmenting an occupancy grid using a Bayes filter, according to an exemplifying embodiment of the present invention.
Figure 11:
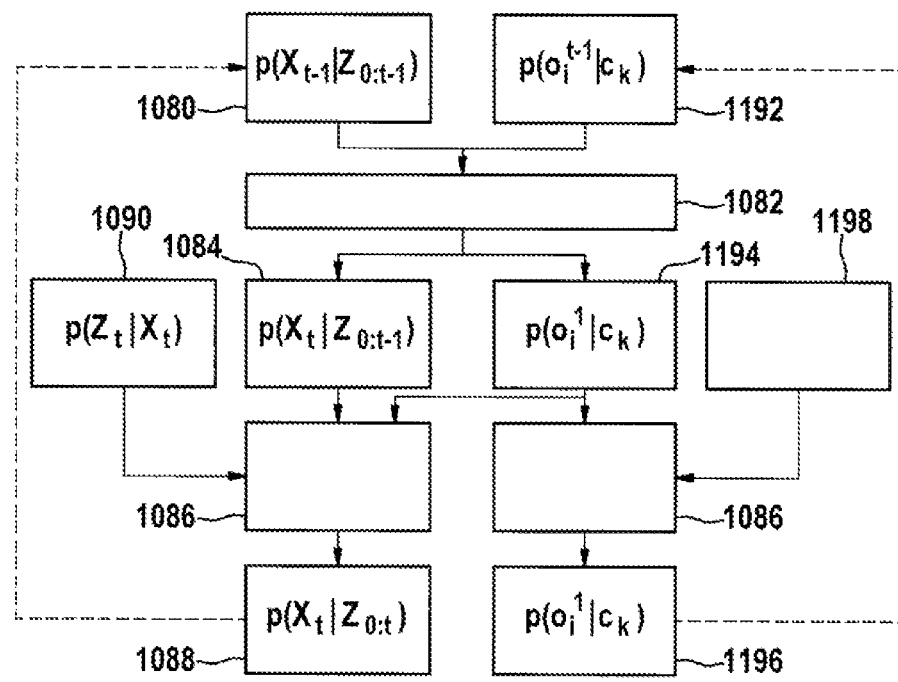
FIG. 11 is a block diagram of a time-related propagation of cell-object assignments in an occupancy grid, according to an exemplifying embodiment of the present invention.
Figure 12:
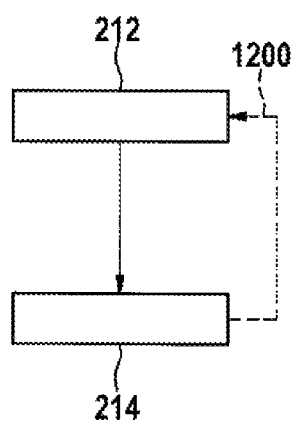
FIG. 12 is a block diagram of a segmentation of an occupancy grid, according to an exemplifying embodiment of the present invention.

The exemplifying embodiments that are described, for example, in FIGS. 10 to 12 show how cell-object affiliations can be used. Advantages with respect to conventional methods are pointed out. It is important to mention here that this is only an exemplifying implementation.

Further applications, and in particular deviations from the specific implementations, are conceivable.

FIG. 10 is a block diagram of a recursive processing structure for segmenting an occupancy grid using a Bayes filter, according to an exemplifying embodiment of the present invention. A block 1080 represents an estimated state as the result of a previous execution of the recursive processing structure depicted. A subsequent block 1082 represents a prediction step. A block 1084 following the prediction step represents the predicted state identified in block 1082. Block 1086, following block 1084 representing the predicted state, represents a correction step, the result of which is represented by a block 1088 as an estimated state. A measured value represented by block 1090 is furnished in the correction step in block 1086. The estimated state depicted by block 1088 is furnished to block 1080 in a subsequent execution of the block diagram shown in FIG. 10. The recursive processing structure of the Bayes filter shown in the block diagram is made up of a prediction step and a correction step.

Assume that $G=\{c_1, \ldots, c_N\}$ is a grid having N grid cells $c_k$, $k=1, \ldots, N$. Assume further that $Xt=\{x_{1,t}, \ldots, x_{N,t}\}$ is the state of grid G at time t which results from the states $x_{k,t}$ of the individual grid cells $c_k$. The state $x_{k,t}$ here encompasses the degree of occupancy of cell $c_k$ at time t as well as possibly further occupancy properties (e.g. speed, height, etc.). The object of a method for constructing an occupancy grid is to estimate the state sequence $X_o, \ldots, X_t$ on the basis of all previous observations $Z_{0:t}=\{Z_0, \ldots, Z_t\}$, where $Z_t=\{z_{1,t}, \ldots, z_{N,t}\}$ describes the observation (measurement) at time t, which is made up of the observations (measurements) $z_{k,t}$ for the individual grid cells $c_k$.

The method most often used to construct an occupancy grid is the Bayesian filter. Using the Markov assumption $p(X_t|X_{t-1}, \ldots, X_0)$ and $p(Z_t|X_t, \ldots, X_o)=p(Z_t|X_t)$, this estimates the probability of a state sequence as $$p(X_0, \ldots, X_t, Z_{0:1}) = p(X_0)\prod_{i=1}^{t} p(Z_t | X_t)p(X_t | X_{t-1}).$$

The probability of a state sequence can be calculated efficiently by recursive application of a prediction step and correction step (see FIG. 4):

Prediction: $p(X_t|Z_{0:t-1})=\int p(X_t|X_{t-1}) \cdot p(X_{t-1}|Z_{0:t-1})dX_{t-1}$ Correction: $p(X_t|Z_{0:t})=\eta \cdot p(Z_t|X_t) \cdot p(X_t|Z_{0:t-1})$ For an occupancy grid this means that in the prediction step, the occupancy of the grid in the next time step is forecast. The occupancies in the grid move for this purpose in accordance with their speed. In the correction step, the forecast is then verified with the aid of the current measurement.

Be it noted at this juncture that other methods for constructing an occupancy grid exist besides the Bayesian filter (e.g. Dempster-Shafer theory of evidence), but they are not explained here.

It is proposed to supplement the state X of the grid with cell-object affiliations, and to propagate those in the grid over time as well. Assume for this purpose that $O=\{O_1, \ldots, O_M\}$ is the set of the M objects in the vehicle surroundings. We then define a probability distribution $p(o_i|c_k)$ that indicates the probability with which the occupancy of cell $c_k$ is brought about by object $o_i$. Here $\Sigma_{i=1}^{M}p(o_i|c_k)=1$ is valid for all values of k.

As depicted in FIG. 11, propagation of the cell-object assignments 1192 occurs in prediction step 1082 of the Bayes filter. Because the cell-object assignments are coupled to the cell occupancies, they move in the grid, together with the occupancies, in accordance with their speeds. In other words, if an occupancy has been brought about by a dynamic object (the occupancy has a speed not equal to 0), the object assignment transitions, together with the occupancy, from one cell into another cell of the grid. The use of the prediction step thus yields a forecast 1194 of the probability with which a cell $c_k$ will be occupied in the next time step by a specific object $o_i$.

Updating of the cell-object assignments occurs by the fact that result 1198 of an object formation is used in the next time step (for example by segmentation of the occupancy grid) as a "measured value" to correct the predicted assignments 1194. The estimated cell-object assignments depicted by block 1196 are furnished to block 1192 in a subsequent execution of the block diagram shown in FIG. 11.

Utilization of the cell-object assignments will be shown below by way of several examples. In a first exemplifying embodiment a segmentation of occupancy grids is carried out. In order to analyze objects in the vehicle surroundings more precisely, typically an object formation based on the occupancy grid takes place. This can be achieved, for example, by segmenting the occupancy grid. Here an assignment $o_i=o(c_k)$ of grid cells $c_k$ to objects $o_i$ is performed; as proposed here and shown in FIG. 12, this assignment can be used as a "measured value" to update the cell-object assignments in the grid. When an object formation is carried out as in FIG. 12, the result of the object formation is based exclusively on the current state of the grid, i.e. the results of object formation at earlier points in time are not used.

Figure 13:
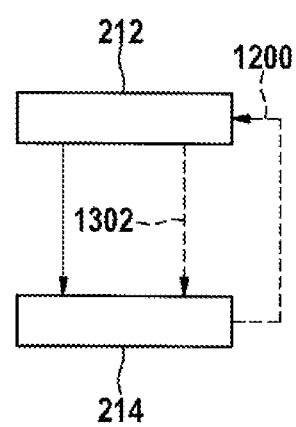
FIG. 13 is a block diagram of a segmentation of an occupancy grid using segmentation results of previous time steps, according to an exemplifying embodiment of the present invention.

Alternatively to this, as shown in FIG. 13, the cell-object assignments predicted in the grid can be used as a prior for segmentation. This useful because they describe, with the incorporation of previous segmentation results, the probabilities with which the cells are associated with the various objects. The incorporation of a prior of this kind allows a "filtered" segmentation to be achieved, thus minimizing noise influences.

In an exemplifying embodiment, an association of segments between time steps is carried out. If no priors are used in the segmentation of an occupancy grid, the results of object formation in successive time steps are mutually independent. In order to achieve continuous object tracking, the objects formed in successive time steps must be mutually associated in accordance with FIG. 14. The cell-object assignments propagated in the occupancy grid can in turn be used for such association. Example: assuming that $O^{t-1}=\{o^{t-1}_1, \ldots o^{t-1}_{M^{t-1}}\}$ are the objects formed in time steps t-1 and t, and that $S^t_i=\{c_k|o^t(c_k)=o^t_i\}$ describes the set of cells assigned to object $o^t_i$, then $$P(o^{t-1}_j | o^t_i) \approx \sum_{c_k \in S^t_i} p(o^{t-1}_{j|ck})$$

indicates the probability that the i-th object from time step t derives from the j-th object from time step t-1.

In an exemplifying embodiment, a use of object-specific motion models is described. If the probability with which a cell is assigned to an object is known, object-specific motion models can be used to predict the occupancy grid. This can be achieved, for example, as follows:

$$p(x_{l,t} | x_{k,t-1}) \approx \sum_{i=1}^{M} p(x_{l,t} | x_{k,t-1}, o_i) \cdot p(o_i | c_k),$$

where $p(x_{l,t}|x_{k,t-1},o_i)$ represents an object-specific motion model.

Object speeds represent a good application example in this regard. Cells that are affiliated with the same object must also move identically, since one object can only have one speed. If grid cells are considered mutually independently, however, then due to ambiguities they have different speeds (even if they are affiliated with the same object). It is therefore proposed here firstly to create models for the speeds of the individual objects based on the cell speeds and the cell object assignments, and then to apply them on the cell level. Occupancies within the cells would then move no longer independently of one another, but instead always with reference to the object that they describe.

In an exemplifying embodiment, a use of object-specific observation models is described. Similarly to the object-specific motion models described above, with the aid of the cell-object assignments it is also possible to use object-specific observation models during the occupancy grid correction step. One possible exemplifying embodiment is represented here by partial masking of objects. Sensors can typically sense objects only partly, i.e. only points that are located on the side facing the sensor and are not masked by other objects. An occupancy grid that does not incorporate any object knowledge, i.e. that considers grid cells as independent, would correspondingly update only the states of the grid cells for which measured values exist.

If object knowledge is incorporated into an occupancy grid with the aid of the above-described cell-object assignments, measured values of cells can serve as implicit measured values of masked cells if they are assigned to the same object. In other words: if I can measure an object, this can be used as a measured value for each cell assigned to the object (even for the cells that could not be measured, for example because of masking).

Similarly to the object-specific motion models, this can be implemented, by way of example, by firstly calculating object-based observation models $p(Z_t|x_{k,t},o_i)$ from the cell-based observation model $p(Z_t|x_{k,t})$ with the aid of the cell-object assignments. It might be the case, for example, that an object is assumed to be "measured" if the object has been "measured" in at least one cell assigned to it. From this in turn it is possible to generate an observation model that can be utilized on a cell level:

$$\hat{p}(Z_t | x_{k,t}) \approx \sum_{i=1}^{M} p(Z_t | x_{k,t}, o_i) \cdot p(o_i | c_k)$$

Similar object-based observation models can also be of interest for other properties of occupancies. Speeds are a good example of this, since occupancies that are brought about by the same object must also move in the same way. In this case different speeds measured on the cell level would firstly be grouped together into object-specific speeds, which then in turn can be applied on the cell level.

FIG. 11 is a block diagram of a time-related propagation of cell-object assignments in an occupancy grid, according to an exemplifying embodiment of the present invention. The block diagram shown in FIG. 11 has blocks 1080, 1082, 1084, 1086, 1088, and 1090 corresponding to FIG. 10. The block diagram in FIG. 11 furthermore encompasses a block 1192 for a cell-object assignment that is furnished by the prediction step represented by block 1082, a block 1194 that represents a predicted cell-object assignment, a block 1196 that represents a cell-object assignment, and a block 1198 that represents a measured value from object formation.

The result of the prediction step in block 1082 is to furnish a predicted state represented by block 1084 and a predicted cell-object assignment represented by block 1194. The predicted cell-object assignment represented by block 1194 is furnished to the two blocks 1086 representing a correction step. A first block 1086 thus receives both a predicted state represented by block 1084 and the predicted cell-object assignment represented by block 1194. Second block 1086 receives the predicted cell-object assignment represented by block 1194. First block 1086 furnishes an estimated state represented by block 1088; second block 1086 furnishes a cell-object assignment furnished by block 1196. A measured value from object formation, represented by block 1198, is also furnished in the second block 1086. FIG. 11 is an illustration of the time-related propagation of cell-object assignments in the Bayesian occupancy grid.

Possibilities for grid segmentation are presented in the next two FIGS. 12 and 13 on the basis of two exemplifying embodiments. The segmentation shown in FIG. 12, for example, is based exclusively on the current state of the occupancy grid. In the exemplifying embodiment shown in FIG. 13, segmentation results of previous time steps are incorporated as a prior, in the form of predicted cell-object assignments, into the segmentation.

FIG. 12 is a block diagram of a segmentation of an occupancy grid according to an exemplifying embodiment of the present invention. A block 212 of constructing the occupancy grid is followed by a block 214 of segmenting the occupancy grid. A result of the segmentation of the occupancy grid carried out in block 214 is furnished to block 212 as an update of cell-object assignments 1200 in order to construct the occupancy grid. The update of cell-object assignments 1200 thus represents grid-cell information or further information about the grid cells of the occupancy grid.

FIG. 13 is a block diagram of a segmentation of an occupancy grid using segmentation results of previous time steps, according to an exemplifying embodiment of the present invention. What is depicted in FIG. 13 corresponds largely to what is depicted in the block diagram of a segmentation of an occupancy grid in FIG. 12, the difference being that cell-object assignments are additionally furnished as priors 1302 from block 212 to block 214.

Figure 14:
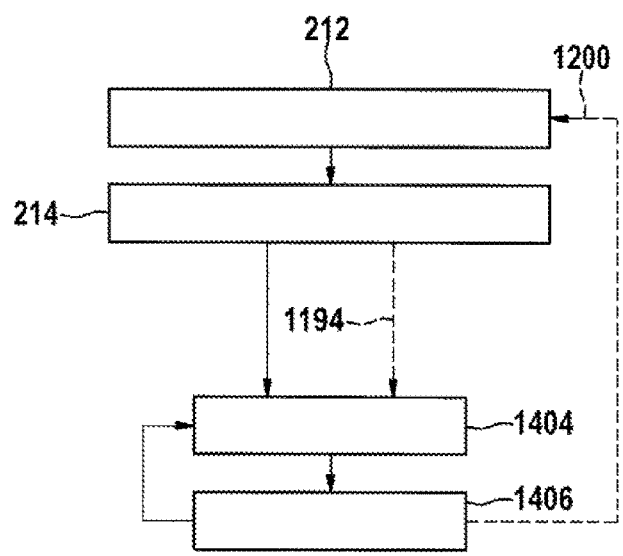
FIG. 14 is a block diagram of a segmentation of an occupancy grid with predicted cell-object assignments, according to an exemplifying embodiment of the present invention.

FIG. 14 is a block diagram of a segmentation of an occupancy grid with predicted cell-object assignments 1194, according to an exemplifying embodiment of the present invention. An occupancy grid is constructed in a block 212 and is then segmented in a block 214. The occupancy grid segmented in block 214 is furnished to a block 1404 for object association. In addition, predicted cell-object assignments 1194 are furnished from block 214 to block 1404. Object association block 1404 is followed by an object tracking block 1406. A result of block 1406 is fed back recursively to block 1404 and furnished to block 212 as an update of cell-object assignments 1200. FIG. 14 offers an illustration of the use of predicted cell-object assignments for the association of objects formed in successive time steps.

Figures 15, 16:
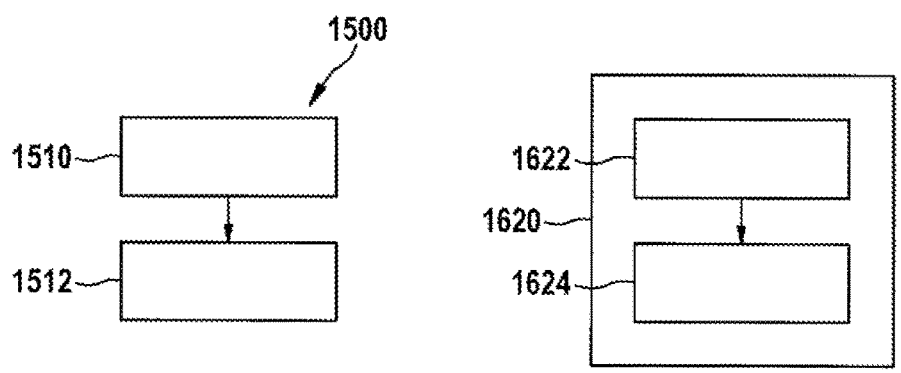
FIG. 15 is a flow chart of a method for segmenting an occupancy grid for a surroundings model of a driver assistance system for a vehicle, according to an exemplifying embodiment of the present invention.
FIG. 16 is a block diagram of an apparatus for segmenting an occupancy grid for a surroundings model of a driver assistance system for a vehicle, according to an exemplifying embodiment of the present invention.

FIG. 15 is a flow chart of a method 1500 for segmenting an occupancy grid for a surroundings model of a driver assistance system for a vehicle, according to an exemplifying embodiment of the present invention. The occupancy grid can be an exemplifying embodiment of an occupancy grid described in FIG. 3, FIG. 4, or FIG. 7 and labeled therein with the reference character 320. Method 1500 for segmenting an occupancy grid for a surroundings model of a driver assistance system for a vehicle encompasses a step 1510 of reading in an occupancy grid having a plurality of grid cells, each grid cell of the plurality of grid cells having assigned to it a grid cell information item that encompasses an information item about a degree of occupancy and at least one additional information item about the cell, as well as a step 1512 of assigning at least one object and/or a plurality of objects to the plurality of grid cells using the grid cell information item, in order to segment the occupancy grid for a surroundings model.

In an exemplifying embodiment, method 1500 has an optional step of projecting the plurality of grid cells as transformed grid cells into a feature space using the grid cell information item. The optional projecting step is located after the reading-in step 1510. In the assigning step 1512, the at least one object and/or the plurality of objects are assigned to the plurality of grid cells using the transformed grid cells in the feature space, or an information item derived therefrom.

Method 1500 optionally encompasses a step of extracting proximity relationships between the transformed grid cells in the feature space. The optional extracting step is located after the optional projecting step. In the optional extracting step, a graph is created in a sub-step using the proximity relationships, nodes of the graph representing the grid cells and edges between the nodes representing proximity relationships; in the assigning step, the at least one object and/or the plurality of objects is assigned to the plurality of grid cells using the proximity relationships and/or the graph and/or an information item derived therefrom.

In an exemplifying embodiment that is not shown, method 1500 encompasses a step of allocating a weight to each edge of the graph using the proximity relationships, the weight representing an affiliation of a node with an object. The optional allocating step is located after the optional extracting step.

In an exemplifying embodiment that is not shown, method 1500 optionally has added to it a step of segmenting the graph using the weight of each edge, such that nodes are grouped into sub-graphs, a sub-graph encompasses only nodes of one object, and in the assigning step 1512 the at least one object and/or the plurality of objects are assigned to the plurality of grid cells using the segmented graph and/or the cliques and/or an information item derived therefrom. The optional segmenting step is located after the allocating step.

In an exemplifying embodiment, method 1500 possesses an optional transforming step after the optional segmenting step, the grid cells of the occupancy grid being assigned to an object in the transforming step using the cliques of the graph.

In an exemplifying embodiment that is not shown, method 1500 encompasses a step of predicting object assignments for the plurality of grid cells after the reading-in step, the grid cell information item for each grid cell encompassing a predicted object assignment and the object assignment being predicted, in the predicting step, using an object assignment and/or a grid cell information item from a previous execution of the method as recited in one of Claims 1 to 7.

In an exemplifying embodiment that is not shown, in an optional predicting step a grid cell information item for each grid cell of the plurality of grid cells is predicted using an object assignment and/or a grid cell information item from a previous execution of the method.

FIG. 16 is a block diagram of an apparatus for segmenting an occupancy grid for a surroundings model of a driver assistance system for a vehicle, according to an exemplifying embodiment of the present invention. The occupancy grid can be an exemplifying embodiment of an occupancy grid described in FIG. 3, FIG. 4, or FIG. 7 and labeled there with the reference character 320. In an exemplifying embodiment, apparatus 1620 is embodied to execute method steps of a method 1500 described in FIG. 15 in corresponding devices. Apparatus 1620 encompasses an interface 1622 for reading in an occupancy grid having a plurality of grid cells, each grid cell of the plurality of grid cells having assigned to it a grid cell information item that encompasses an information item about a degree of occupancy and at least one additional information item about the cell, as well as a device 1624 for assigning at least one object and/or a plurality of objects to the plurality of grid cells using the grid cell information item, in order to segment the occupancy grid for a surroundings model.

The exemplifying embodiments that have been described and shown in the Figures are selected merely by way of example. Different exemplifying embodiments can be combined with one another completely or only with regard to individual features. An exemplifying embodiment can also be supplemented with features of a further exemplifying embodiment.

The method steps presented here can moreover be executed repeatedly and in a sequence other than the one described.

If an exemplifying embodiment encompasses an "and/or" relationship between a first feature and a second feature, this is to be read such that the exemplifying embodiment according to one embodiment has both the first feature and the second feature, and according to a further embodiment has either only the first feature or only the second feature.

What is claimed is:

1. A method for segmenting an occupancy grid for a surroundings model of a driver assistance system for a vehicle, comprising:
reading in an occupancy grid having a plurality of grid cells, each grid cell of the plurality of grid cells having assigned thereto a grid cell information item that encompasses an information item about a degree of occupancy and at least one additional information item about the grid cell;
assigning at least one of at least one object and a plurality of objects to the plurality of grid cells using the grid cell information item, in order to segment the occupancy grid for a surroundings model; and
predicting object assignments for the plurality of grid cells after the reading-in step, the grid cell information item for each grid cell encompassing a predicted object assignment, wherein in the predicting step the object assignment is predicted using at least one of an object assignment and a grid cell information item from a previous execution of the method.

2. The method as recited in claim 1, further comprising:
projecting the plurality of grid cells as transformed grid cells into a feature space using the grid cell information item, wherein in the assigning step the at least one of the at least one object and the plurality of objects is assigned to the plurality of grid cells using one of the transformed grid cells in the feature space and an information item derived therefrom.

3. The method as recited in claim 1, further comprising:
extracting proximity relationships between the transformed grid cells in a feature space and preparing a graph using the proximity relationships, nodes of the graph representing the grid cells, and edges between the nodes representing proximity relationships, wherein in the assigning step the at least one of the at least one object and the plurality of objects is assigned to the plurality of grid cells using at least one of the proximity relationships, the graph, and an information item derived therefrom.

4. The method as recited in claim 3, further comprising:
allocating a weight to each edge of the graph using the proximity relationships, the weight representing an affiliation of a node with an object.

5. A method for segmenting an occupancy grid for a surroundings model of a driver assistance system for a vehicle, comprising:
reading in an occupancy grid having a plurality of grid cells, each grid cell of the plurality of grid cells having assigned thereto a grid cell information item that encompasses an information item about a degree of occupancy and at least one additional information item about the grid cell;
assigning at least one of at least one object and a plurality of objects to the plurality of grid cells using the grid cell information item, in order to segment the occupancy grid for a surroundings model;
extracting proximity relationships between the transformed grid cells in a feature space and preparing a graph using the proximity relationships, nodes of the graph representing the grid cells, and edges between the nodes representing proximity relationships, wherein in the assigning step the at least one of the at least one object and the plurality of objects is assigned to the plurality of grid cells using at least one of the proximity relationships, the graph, and an information item derived therefrom;
allocating a weight to each edge of the graph using the proximity relationships, the weight representing an affiliation of a node with an object; and
segmenting the graph using the weight of each edge nodes being combined into sub-graphs, a sub-graph encompassing only nodes of one object, wherein in the assigning step the at least one of the at least one object and the plurality of objects is assigned to the plurality of grid cells using at least one of the segmented graph, cliques, and an information item derived therefrom.

6. The method as recited in claim 5, further comprising:
after the segmenting step, performing a transforming step in which the grid cells of the occupancy grid are assigned to an object using the sub-graphs of the graph.

7. The method as recited in claim 1, wherein, in the predicting step, for each grid cell of the plurality of grid cells, a grid cell information item is predicted using at least one of an object assignment and a grid cell information item from a previous execution of the method.

8. An apparatus for segmenting an occupancy grid for a surroundings model of a driver assistance system for a vehicle, the apparatus comprising:
an interface for reading in an occupancy grid having a plurality of grid cells, each grid cell of the plurality of grid cells having assigned thereto a grid cell information item that encompasses an information item about a degree of occupancy and at least one additional information item about the grid cell;
a device for assigning at least one of at least one object and a plurality of objects to the plurality of grid cells using the grid cell information item, in order to segment the occupancy grid for a surroundings model; and
a device for predicting object assignments for the plurality of grid cells after reading in the occupancy grid, the grid cell information item for each grid cell encompassing a predicted object assignment, wherein the device for predicting predicts the object assignment using at least one of an object assignment and a grid cell information item from a previous execution of the segmenting by the apparatus.

9. A non-transitory computer program product having program code for carrying out a method when the program product is executed on at least one of an apparatus, a computer, and a control unit, the method being for segmenting an occupancy grid for a surroundings model of a driver assistance system for a vehicle, the method comprising:
reading in an occupancy grid having a plurality of grid cells, each grid cell of the plurality of grid cells having assigned thereto a grid cell information item that encompasses an information item about a degree of occupancy and at least one additional information item about the grid cell;
assigning at least one of at least one object and a plurality of objects to the plurality of grid cells using the grid cell information item, in order to segment the occupancy grid for a surroundings model; and
predicting object assignments for the plurality of grid cells after the reading-in step, the grid cell information item for each grid cell encompassing a predicted object assignment, wherein in the predicting step the object assignment is predicted using at least one of an object assignment and a grid cell information item from a previous execution of the method.

\* \* \* \* \*